United States Patent [19]
Ginetti et al.

[11] Patent Number: 5,956,257
[45] Date of Patent: Sep. 21, 1999

[54] AUTOMATED OPTIMIZATION OF HIERARCHICAL NETLISTS

[75] Inventors: Arnold Ginetti, Antibes, France; Thomas J. Schaefer, Cupertino, Calif.; Robert D. Shur, Los Altos, Calif.; Christopher H. Kingsley, San Jose, Calif.

[73] Assignee: VLSI Technology, Inc., San Jose, Calif.

[21] Appl. No.: 08/040,738

[22] Filed: Mar. 31, 1993

[51] Int. Cl.⁶ .................................................. G06F 17/50
[52] U.S. Cl. .......................... 364/490; 364/488; 364/489
[58] Field of Search .................................... 364/488, 489, 364/490, 491, 578, 900

[56] References Cited

U.S. PATENT DOCUMENTS

| | | | |
|---|---|---|---|
| 4,263,651 | 4/1981 | Donath et al. | 364/490 |
| 4,698,760 | 10/1987 | Lembach et al. | 364/490 |
| 4,703,435 | 10/1987 | Darringer et al. | 364/489 |
| 4,922,432 | 5/1990 | Kobayashi et al. | 364/490 |
| 4,924,430 | 5/1990 | Zasio et al. | 364/578 |
| 4,967,367 | 10/1990 | Piednoir | 364/489 |
| 5,005,136 | 4/1991 | Van Berkel et al. | 364/490 |
| 5,077,676 | 12/1991 | Johnson et al. | 364/489 |
| 5,111,413 | 5/1992 | Lazansky et al. | 364/578 |
| 5,168,455 | 12/1992 | Hooper | 364/490 |
| 5,202,841 | 4/1993 | Tani | 364/491 |
| 5,210,700 | 5/1993 | Tom | 364/489 |
| 5,218,551 | 6/1993 | Agrawal et al. | 364/491 |
| 5,222,030 | 6/1993 | Dangelo et al. | 364/489 |
| 5,301,318 | 4/1994 | Mittal | 395/600 |
| 5,311,443 | 5/1994 | Crain et al. | 364/491 |
| 5,325,309 | 6/1994 | Halaviati et al. | 364/488 |
| 5,402,357 | 3/1995 | Schaefer et al. | 364/490 |
| 5,426,591 | 6/1995 | Ginetti et al. | 364/489 |
| 5,461,576 | 10/1995 | Tsay et al. | 364/490 |

OTHER PUBLICATIONS

Daniel Weise, "Multilevel Verification of MOS Circuit", IEEE Trans. on Computer Design, vol. 9, No. 4, pp. 341–351, Apr. 1990.

Synopsys Design Compiler Technical Data Sheet, Version 1.3, 1990.

Primitive Model Description Cell User Guide, Compass Design Automation, V8R3,1991.

Volker Henkel and Ulrich Golzc, "A Reduced Instruction Set Circuit Extractor for Hierarchical VLSI Layout Verification Based on Interaction Rule," IEEE, 1988 Custon Integrated Circuits Conference, pp. 7–4–1–7–4–4.

*Primary Examiner*—Kevin J. Teska
*Assistant Examiner*—Thai Phan
*Attorney, Agent, or Firm*—Flehr Hohbach Test Albritton & Herbert LLP

[57] ABSTRACT

A method of automatically optimizing a hierarchical netlist of integrated circuit cells comprising at least one upper-level cell containing a multiplicity of subsidiary cells of lower hierachical level includes receiving data defining said netlist and timing constraints for it, and establishing abstract timing models for all the subsidiary cells. Timing constraints are propagated to at least one selected subsidiary cell and this cell is optimized by means of a flat optimizer to produced an optimized version of the selected subsidiary cell. The optimized version of the selected cell is inserted into the netlist. The timing constraints denote arrival times for signals at inputs of a cell and required times for signals at outputs of a cell and each abstract timing model of a cell comprises timing parameters which enable a delay time between a specified input of a cell to a specified output of a cell to be computed.

11 Claims, 9 Drawing Sheets

FIG. 3
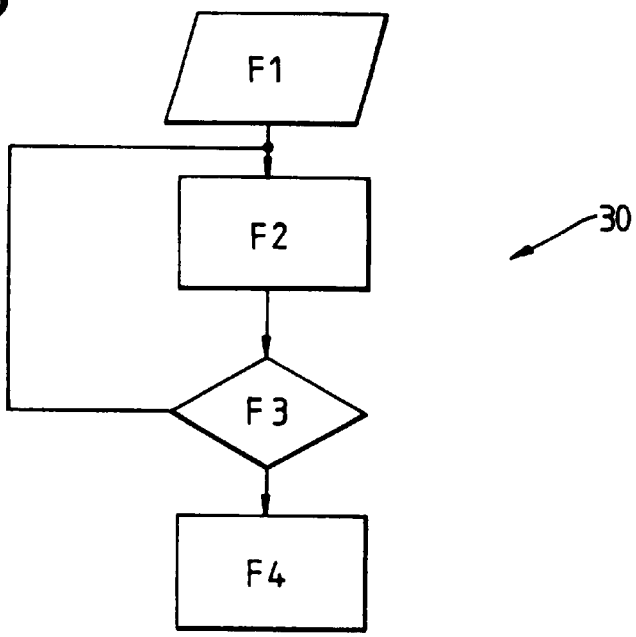
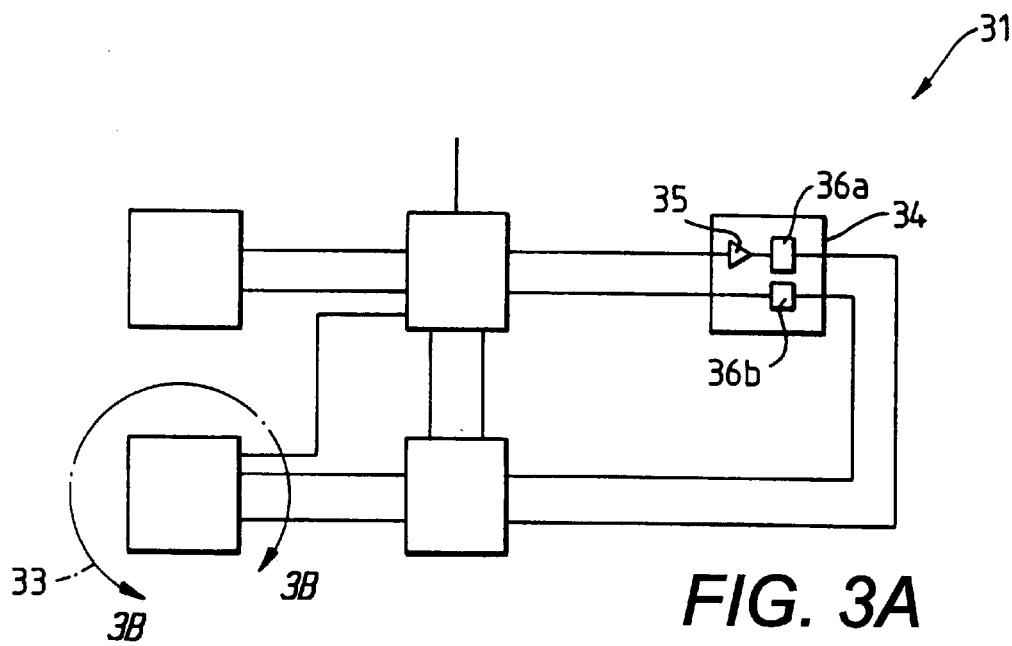
FIG. 3A
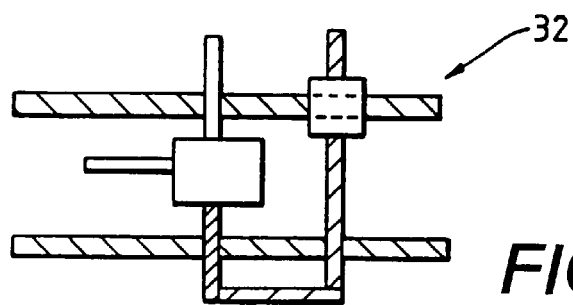
FIG. 3B

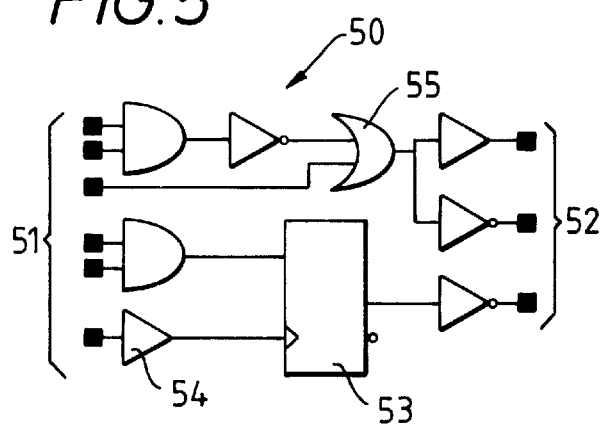
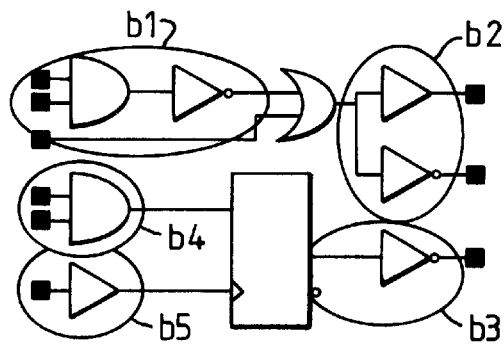
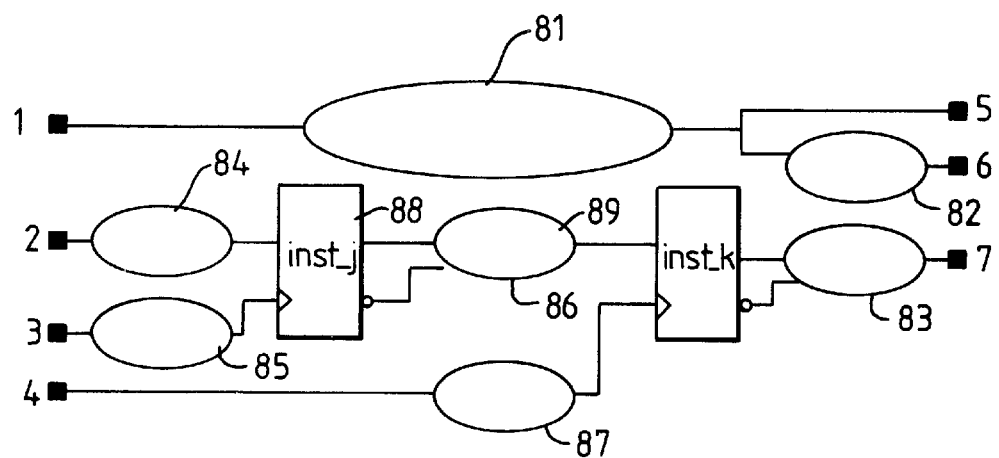

AUTOMATED OPTIMIZATION OF HIERARCHICAL NETLISTS

FIELD OF THE INVENTION

The present invention relates to the computer-aided design of integrated circuits, particularly very large scale application-specific integrated circuits, and particularly relates to a system and method for the generation of optimized netlists, for the control of an automated fabrication process, wherein the netlists are composed of cells obtained from a cell library and the cells are arranged in a hierarchy wherein upper-level cells are composed of and defined by a multiplicity of lower-level cells.

BACKGROUND TO THE INVENTION

The design of very large scale integrated circuits, particularly application specific integrated circuits, is almost invariably performed with the aid of a computerized design tool, namely a data processor which is programmed with an operating program normally called a compiler. The data processor accepts user-selected inputs, which may be a high level schematic comprising icons and their interconnections. The high level specification is independent of architecture, defining the desired application specific circuit in terms of generalized functional schematic blocks. The data processor computes, employing sub-programs or macros appropriate to each signal processing function, a netlist. This is a structural level definition which includes a list of the integrated circuit hardware cells needed to achieve the functional specification. The cells are selected from a cell library, i.e. a data store of previously designed hardware cells of various functions and technical specification. The netlist also specifies wiring interconnecting the selected hardware cells. From the netlist it is readily feasible using existing computer aided design layout systems to generate the detailed mask data required to produce the particular application specific integrated circuit in chip form. Reference may be made to U.S. Pat. No. 4,922,432 issued May 1, 1990 to Kobayashi et al. for a description of the nature and use of cell libraries.

Other references which illustrate the state of the art are U.S. Pat. Nos. 4,703,435, issued Oct. 27, 1987 to Darringer et al., 4,967,367 issued Oct. 30, 1990 to Piednoir and 5,005,136 issued Apr. 2, 1991 to Van Berkel et al.

An important stage in the automated design process is called optimization of the netlist. The cell library defines various circuits such as gates, OR gates, exclusive-OR gates, flip-flops, latches, multiplexed flip-flops full adders and suchlike. The cell library also contains, in respect of each circuit, timing information by means of which the propagation time of a signal between the pins, i.e. terminals of a cell under specified conditions can be computed. Various optimization routines exist in known practice. Broadly speaking, they comprise spatial optimization routines and temporal optimization routines. In the former, a provisional netlist is analysed by the computer and, in accordance with appropriate algorithms, the provisional netlist is modified in order, for example, to utilize the area more efficiently or to reorganise the layout of the cells so as to eliminate features which are awkward or inconvenient for fabrication. As far as temporal optimization routines are concerned, the propagation time of various signals may be computed according to the information in the cell library and the provisional netlist is reorganised to improve the performance of the circuit in this respect. Generally speaking, there may be a conflict between optimization for area and an optimization for speed of performance and sophisticated optimization routines need to include algorithms which will achieve an appropriate compromise between the optimal requirements of area and timing.

One example of a netlist optimization procedure is given by copending application Ser. No. 07/356023 filed May 23rd, 1989, assigned to the same assignee as the present application.

Known optimization procedures presume that the netlist is not hierarchical, that is to say the structural specification of each cell in the netlist is self-sufficient, as exemplified by Kobayashi et al., previously cited.

However, for a variety of purposes it is useful to employ a hierarchical netlist, wherein a high-level cell in the cell library is not necessarily employed directly for the computation of the masks because it comprises a multiplicity of cells which are likewise obtained from the cell library but are more primitive than the high level cell and which themselves are employed for the conversion of the structural specification into the semiconductor mask data. More than two levels of the hierarchy are possible. For example, a high level cell could be a multiplier which contains multiple instances of a lower level cell such as an adder, which contains instances of lowest level cells such as AND and OR gates.

The main object of the present invention is to facilitate the automated optimization of a hierarchical netlist, particularly within a mechanised or computer aided process for the design, layout and fabrication of a large scale integrated circuit. A principal difficulty in the way of achieving this object is that known logic optimizers, such as the commercially available Compass v8r3.1 Logic Optimizer, are capable of optimizing only a flat (that is, non-hierarchical) netlist. Using such an optimizer, a designer who wishes to optimize a hierarchical design must choose between two methods, viz (i) flattening the netlist and then optimizing it; or (ii) optimizing each subcell individually. The first method has the disadvantage that the flattened netlist can be considerably larger than the hierarchical netlist, placing great demands on the memory and the central processing unit of the optimizer. For example, if the top-level cell contains eight instances of cell A and cell A contains thirty-two instances of cell B, the flattened netlist contains two hundred and fifty-six instances of cell B. Thus, the 'flat' optimizer will spend an inordinate processing time optimizing two hundred and fifty-six essentially identical copies of the same logic. The flattened netlist could easily become so large that the 'flat' optimizer cannot accommodate it.

Another disadvantage is that the resulting optimized netlist lacks hierarchy, making it difficult for the user to make further checks or alterations to the optimized netlist. It would be more convenient for the user if the optimized netlist preserved the hierarchy The second approach would normally place a huge burden on the user, as to how to provide meaningful timing constraints for each subcell being optimized. The user would rather just specify timing constraints for the top-level cell, so that the optimizer would automatically compute appropriate constraints for each subcell.

The present invention is based on the automation of the second approach mentioned above. In broad terms, an optimizer system according to the invention receives as inputs a netlist and user-specified timing constraints. The timing constraints preferably comprise predetermined times of arrival of signals at each of a set of source nodes and required times of appearance of signals at a set of destination or output nodes. The system is arranged to compute, for each type of subcell, an abstract timing model. In essence this is a pin-to-pin timing model of the subcell. Using the specified timing constraints and the abstract timing models, the constraints are propagated, starting with the top-most cell, down through the cell hierarchy, at least as far as a target subcell. Then a flat optimizer can be employed to optimize the target subcell, or the specific instance of it, subject to the timing constraints propagated to it. Where there are multiple instances of a particular subcell, the timing constraints can be merged, so as to avoid the need for separately optimizing each instance of the subcell.

An entire hierarchical netlist may therefore be automatically optimized according to the invention by (i) selecting, using an appropriate algorithmic procedure, a subcell to be optimized; (ii) optimizing that subcell; (iii) substituting the optimized subcell for the original subcell throughout the hierarchical netlist; and (iv) repeating the procedure until all subcells have been optimized. Other features and advantages of the invention will become apparent from the description which follows.

BRIEF DESCRIPTION OF THE DRAWINGS

FIG. 3, FIG. 3a, and FIG. 3b illustrate relationships between a high-level specification, elements of a hierarchical netlist and part of an application specific integrated circuit.

FIG. 5 illustrates a simple, non-hierarchical netlist.

FIG. 6 illustrates the partitioning of the netlist of FIG. 5 into blocks for optimization.

FIG. 8A illustrates a cell selected for the development of an abstract timing model.

DESCRIPTION OF A PREFERRED EMBODIMENT

Introduction

As indicated hereinbefore, the present invention is generally intended for use within an automated design process wherein input data representing a user-selected, architecture-independent, specification of circuit functions is converted by way of data representing a structural definition of an application specific integrated circuit, i.e. a detailed netlist composed of cells obtained from a data storage device in which the stored data represents hardware circuit cells, to a detailed specification of mask data adapted to control an automated design and fabrication process for the integrated circuit.

Figure 2:
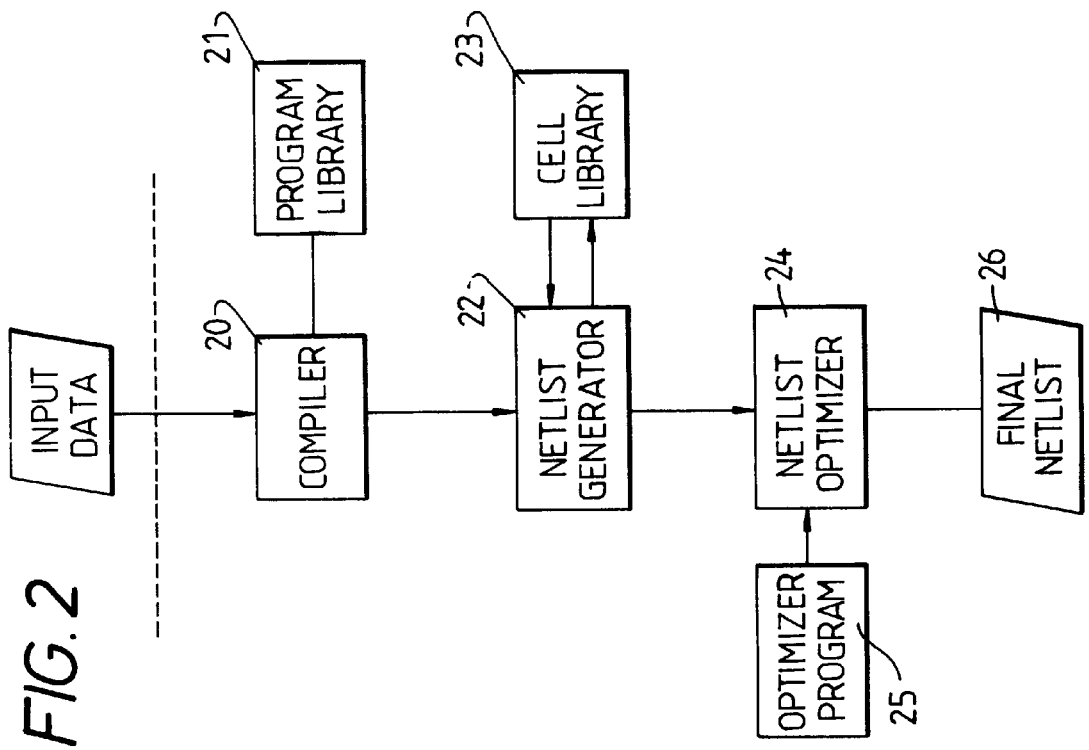
FIG. 2 illustrates the main elements of an automated system for performing the process of FIG. 1.
Figure 1:
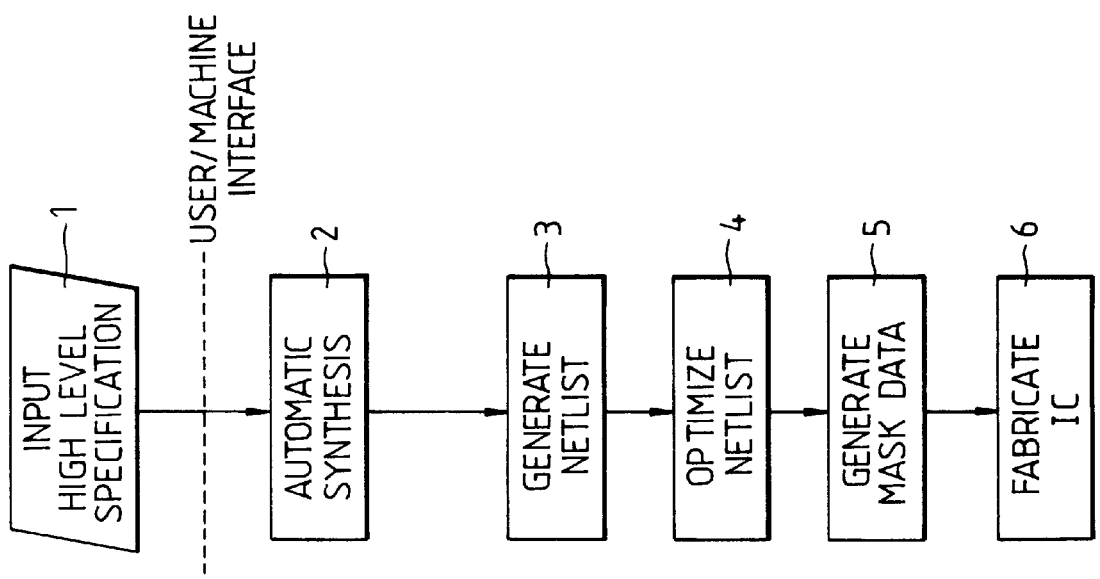
FIG. 1 is a flow-chart for an automated process for the design and layout and fabrication of an integrated circuit.

The automated design process, which will be generally familiar to those skilled in the art, is illustrated in FIGS. 1 to 3, of which FIG. 1 is a flow-chart showing the principal stages in the automated conversion of user-selected input data 1 defining a high-level architecture—independent specification of circuit function, as indicated by the flow-chart 30 in FIG. 3, into an integrated circuit implementing the circuit function in the desired technical realization (e.g. CMOS circuits). As shown in FIG. 2, which illustrates schematically the programmed data processor, the input data is employed by a compiler 20 which has recourse to a programme library 21 to provide the step 2 of automatic synthesis, including optimization and minimization as desired, of FIG. 1. The automated process includes the generation of a netlist (stage 3, FIG. 1) of cells and their interconnections. For this purpose the netlist generator 22 (FIG. 2) retrieves data representing selected cells from the cell library 23 (FIG. 2). Such a process is more fully described by Kobayashi et al., previously cited. The flow chart 30 in FIG. 3 comprises blocks having functions labelled F1 to F4. A corresponding netlist is represented in grossly simplified form at 31 in FIG. 3a. In practice the netlist is constituted by a program segment listing the cells, their pins (terminals) and their connections. The blocks therein represent the cells retrieved from the cell library. Each cell is constituted by data which represents the cell in a structural form that can be used to generate mask data (step 5, FIG. 1) for the fabrication of the integrated circuit (step 6, FIG. 1).

It is customary to perform optimization of a provisional netlist to produce a final netlist before the mask data is generated. Such optimization is shown in FIG. 1 by stage 4 and in FIG. 2 by the netlist optimizer 24 which is controlled by the optimizer program 25 to produce the final netlist 26.

FIG. 3b illustrates in simplified form a portion 32 of an integrated circuit, the portion corresponding (for example) to a cell 33 of the netlist 31.

FIG. 3a also shows a hierarchical cell 34, containing one example of one kind of subcell 35 and two examples 36a and 36b of a different subcell 36. In the generation of the netlist, the netlist generator will retrieve cell 34 from the library and in response to each instance of subcell 36, retrieve from the library the data relevant to that subcell. This example illustrates a two-level hierarchy: but a greater number of levels is feasible

Introduction to Hierarchical Optimization

Before the preferred procedure for hierarchical optimization according to the invention, it is convenient to discuss three aspects of the procedure, namely (i) flat, i.e. non-hierarchical optimization; (ii) the propagation of timing constraints; and (iii) abstract timing models. These are discussed in their turn below.

A Flat Optimizer

Figure 4:
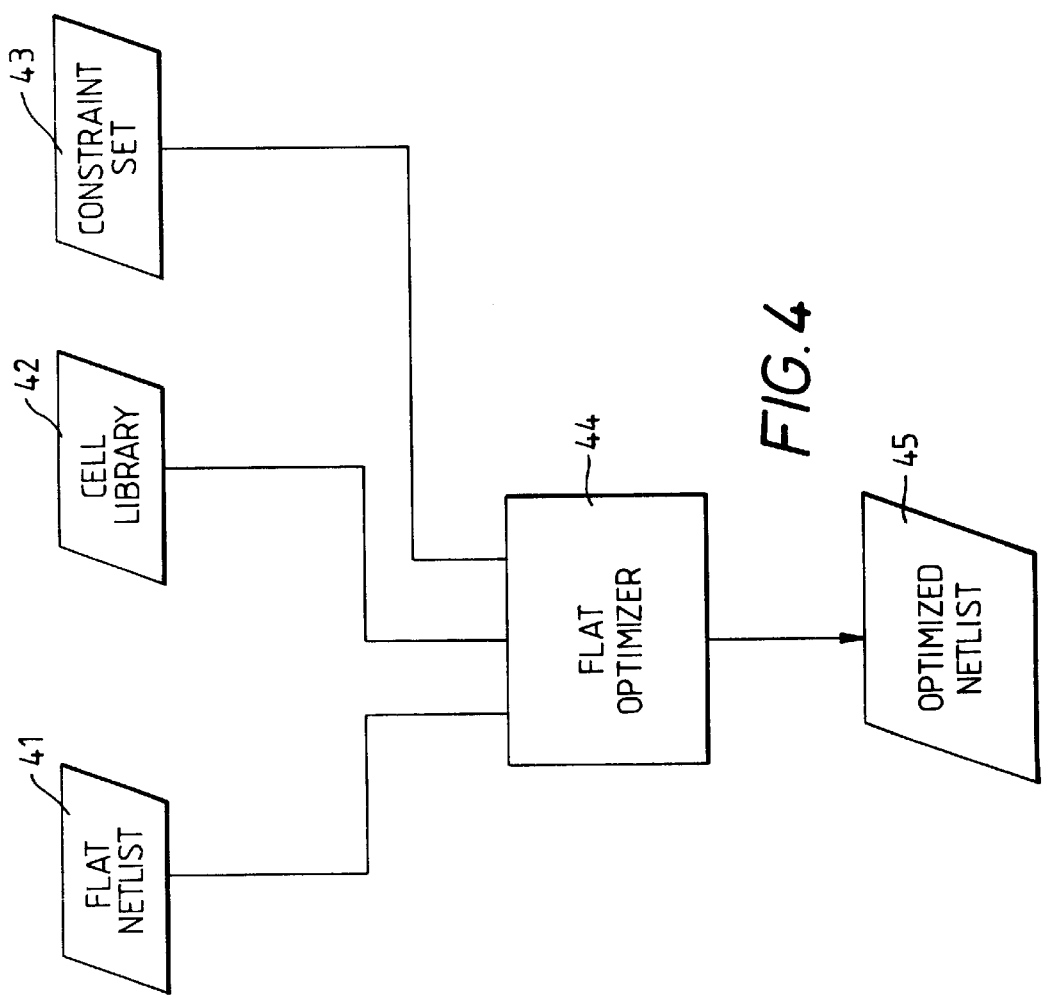
FIG. 4 illustrates the operation of a flat optimizer.

This section describes the flat optimizer on which the hierarchical optimizer is built. The flat optimizer is schematically illustrated in FIG. 4. The input to the flat optimizer consists of a flat netlist 41, data from a cell library 42, and a set of parameters which we refer to as a 'constraint set' 43. The optimizer 44 computes from these inputs an optimized netlist 45. It does so by optimizing each 'block' that is capable of, or selected for, optimization in the netlist and reinserting each such optimized block into the original netlist.

The component instances occurring in a flat netlist are of three types: combinatorial gates, sequential elements, and 'excluded instances'. An excluded instance is an instance of a cell which is excluded from the optimization, either because of limitations of the optimization algorithm, which may not be intended to include certain types of cell, such as tristate buffers or because the user has specified that the instance should not be optimized.

FIG. 5 shows a simple example of a network 50 which has six input nodes 51, three output nodes 52, a sequential or memory element, i.e. an edge-triggered flip-flop 53, and various combinatorial elements, i.e. the AND gates, OR gates and inverters. The network 50 is provided in the form of a netlist 41 of cells and their interconnections to the optimizer of FIG. 4. It may be presumed for the present that all the elements are available as cells in the cell library or technology library.

The technology library (42, FIG. 4) provides for each cell information for implementing the design. For each cell, the information normally includes the area of the element, the number of the terminals (pins), the capacitance at each pin and various timing parameters, which enable signal delay to be computed from any input pin to any output pin as a function of output load.

Typically, the set of constraints (43, FIG. 4) comprises the signal drive strengths at all input nodes, external loads at all output nodes, arrival times of signals at some or all of the input nodes, required times for signals at some or all of the output nodes, and required times for signals at some or all the input pins of sequential elements. The usual goals of optimization are first to minimize the maximum interval by which a signal at any output pin misses its required time, and secondly to minimize the area actually occupied by the circuit. The two goals are not necessarily compatible; one may be subordinated to the other. Typically, a flat optimizer requires all clock signals to be externally supplied. Specifically, all clock pins of sequential elements should be either directly connected to input nodes or derived from input nodes by way of inverters and/or buffers only. In the simple network of FIG. 5, the clock input pin of the flip-flop 53 is connected to an input node only by way of an inverter 54.

Figure 7:
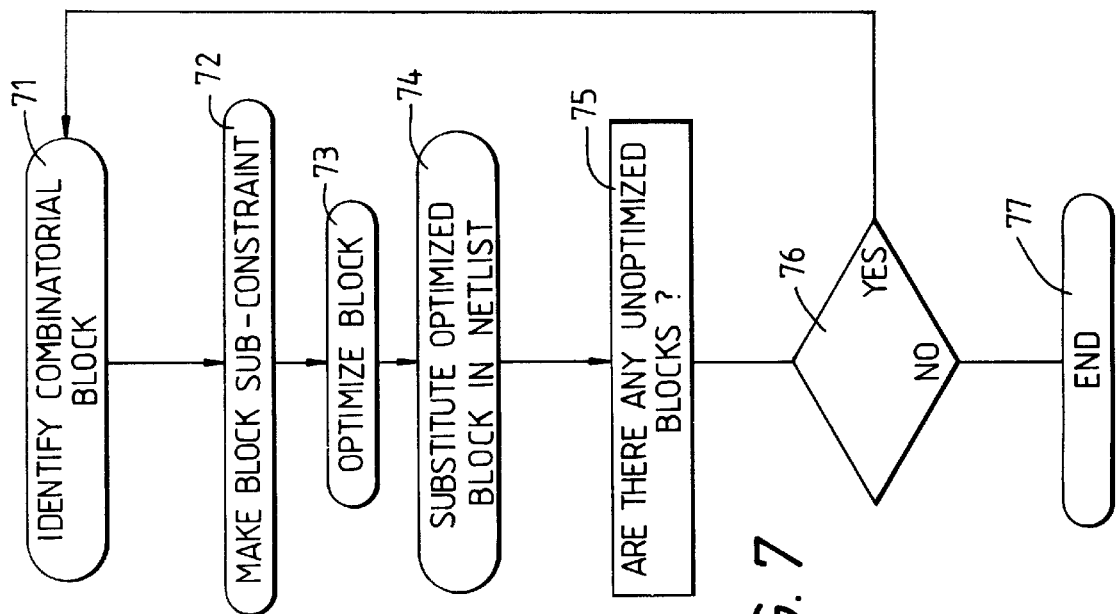
FIG. 7 illustrates the algorithm for the optimization of a flat netlist.

FIG. 6 illustrates the network of FIG. 5 notionally partitioned into blocks for the optimization of its corresponding netlist according to a flat optimization algorithm as shown in FIG. 7. The first step 71 in the algorithm is to identify the 'combinatorial blocks', that is, the maximal interconnected blocks of combinatorial gates, other than 'excluded' instances. Assuming for the sake of example that the OR gate 55 is an excluded instance in FIG. 5, there are five combinatorial blocks in the netlist. The blocks are denoted b1 to b5 in FIG. 6. The inputs to block b3 include both positive and negative outputs of the sequential element, so that both these signals will be available for optimizing the block b3.

The 'induced' constraint set for a block, i.e. the MAKE BLOCK SUBCONSTRAINT procedure 72, is computed as follows. First, signal arrival times are propagated from the input connectors to each node of the netlist, in topological order. Next, required times are propagated from the output connectors to each node of the netlist, in reverse topological order. The arrival time at an output connector is the maximum total time, considering all input pins having a timing path to the output, of the arrival time at an input pin plus the input-to-output delay. The arrival time at a multiply driven node is the maximum arrival time of any pin or input connector driving the node. The required time of an instance input pin is the minimum, for all outputs having a timing path from the input, of an output pin's required time minus the input-to-output delay. The required time of a node with fanout is the minimum of the required times of the input pins or output connectors to which it fans out.)

In this way, one obtains a constraint set for the combinatorial block, consisting of: the arrival times at the input nodes of the block; the required times at the output nodes of the block; the signal drive strength of each input node; and the load on each output node. These last two items are readily obtained from the netlist and the top-level constraint set. If an output of a combinatorial block is the data input of a sequential element, its required time is adjusted before propagating, by subtracting from it the setup time of the sequential element input pin with respect to the element's clock pine. This adjustment is made for the convenience of the user, who normally prefers to state constraints in terms of the desired clock cycle time.

Then the combinatorial block is optimized (stage 73, FIG. 7) and reinserted into the original netlist (stage 74, FIG. 7). Optimization includes Boolean optimization and technology mapping. Boolean optimization aims at reducing the complexity of the logic. Technology mapping selects the best combinatorial cells from the technology library to implement the optimized logic. The details of these two steps are not relevant to the present invention and are well described in the available literature.

The algorithm proceeds for all as yet un-optimized and non-excluded blocks until none remain (stages 76 and 77, FIG. 7).

The foregoing description assumes that the netlist is 'flat', i.e. non-hierarchical. In what follows, the treatment of a hierarchical netlist such that it can be optimized, either globally or selectively, by a non-hierarchical optimizer, is described. Two main features of the treatment are (i) the generation of abstract timing models; and (ii) the propagation of constraints for subcells nested within higher cells.

Abstract Timing Models

An important feature of the hierarchical optimizer is the automatic generation of an abstract timing model for each subcell. The term 'pseudo-PMD' may be used to refer to such a timing model, because it contains the same kind of information as the 'PMD' (Primitive Module Descriptor) files that are available in the automatic design tools (such as the aforementioned logic optimizer) for all basic library cells. Such an abstract timing model is a means for representing the timing and electrical information of the cells and comprises timing parameters that allow the delay from a specified input of the cell to a specified output of the cell to be computed, for example, as a function of the capacitive load on the output. Preferably the abstract timing model includes the parameters:

(a) pin-to-pin timing parameters for each input-to-output path through the cell. The pin-to-pin parameters are: rising propagation delay, falling propagation delay, rising ramp factor, falling ramp factor, and inversion flag. The inversion flag has one of three values: inverting, noninverting, or indeterminate, depending on whether the input-to-output path is inverting, non-inverting, or neither of these.

(b) extra-pin ramp factors i.e. rising and falling ramp factors for any pair of output pins such that the delay from an input conductor to the first pin of a pair depends on the load on the second pin of the pair. For example, if an input pin a is connected by a path to output pins b and c, so that the pair of output pins (b, c) has an extra timing with respect to input pin a, the extra-pin factor may be noted as extra-pin a b c: in other words, the output pin 3 is on the timing path a→c.

(c) the capacitance of each input and output pin.

(d) setup timing parameters.

The process for generating an abstract timing model will be illustrated with the aid of FIG. 8A, which illustrates a simple netlist having input pins 1–4, output pins 5–7, combinatorial blocks 81–87 and sequential elements 88 and 89 (also denoted inst j and inst k). In this section, the term 'netlist' refers to the cell being optimized, and the term 'subcell' refers to cells contained in it.

First, for each input connector j of the netlist and each combinatorial path output k reachable from j, the system computes the longest path delay from j to k. If the combinatorial path output k is an output connector of the netlist, the pin-to-pin propagation delay from input j to output k is set to this path delay minus the product of the external load on output k and the ramp factor driving output k; and the pin-to-pin ramp factor from j to k is set to this ramp factor. If the combinatorial path output is the data input of a sequential element, with associated clock pin h, the setup time of input j with respect to the input connector driving clock pin h is set to the computed path delay plus the setup time of data pin k with respect to clock pin h. The hold time for the same pin pair is set to the hold time of the data pin with respect to the clock pin minus the delay to the clock pin from the input connector driving it. A given input connector may have setup and hold restrictions with respect to more than one 'clock' input connector; in this case, a separate entry is created in the abstract timing model for each such pair, and the name of the underlying sequential-element instance of each is recorded in the model.

More accurate setup and hold times could be computed if minimum as well as maximum path delays were available. For example, the setup time could be computed as the path delay plus the setup time of the sequential element minus the minimum delay to the clock pin of the sequential element Extra-pin timing may be computed as follows. If any output connector is on the critical path from some input connector to some other output connector, the extra-pin ramp factor of the second output with respect to the first output is set to the ramp factor of the instance pin driving the first one. The occurrence of multiple extra-pin timing is discussed below.

The abstract timing information of the netlist shown in FIG. 8A consists of the following:

| pin-to-pin | 1 | 5 | prop rise | prop fall | ramp rise | ramp fall |
|---|---|---|---|---|---|---|
| pin-to-pin | 1 | 6 | prop rise | prop fall | ramp rise | ramp fall |
| pin-to-pin | 4 | 7 | prop rise | prop fall | ramp rise | ramp fall |
| extra-pin | 1 | 5 | 6 | | ramp rise | ramp fall |
| setup | 2 | 3 | inst j | setup hold | | |
| setup | 3 | 4 | inst k | setup hold | | |

The electrical information consists of capacitance values for each input and output connector of the netlist.

The method for producing abstract timing models can work for any cell, provided that every subcell occurring in that cell has an abstract timing model, i.e. either a PMD or a pseudo-PMD, containing the above items of information. Thus, to generate abstract timing models for an entire hierarchical netlist, one applies the method in a bottom-up order, starting with the deepest cells of the hierarchy. An abstract timing model or pseudo-PMD is generated for a cell only after abstract timing models have been generated for all subcells occurring in the cell.

All primitive (leaf) cells may be assumed to already be described by such models. The bottom-up order ensures that all subcells of the cell being processed have abstract timing models.

Multiple Extra-Pin Timing

Figure 8B:
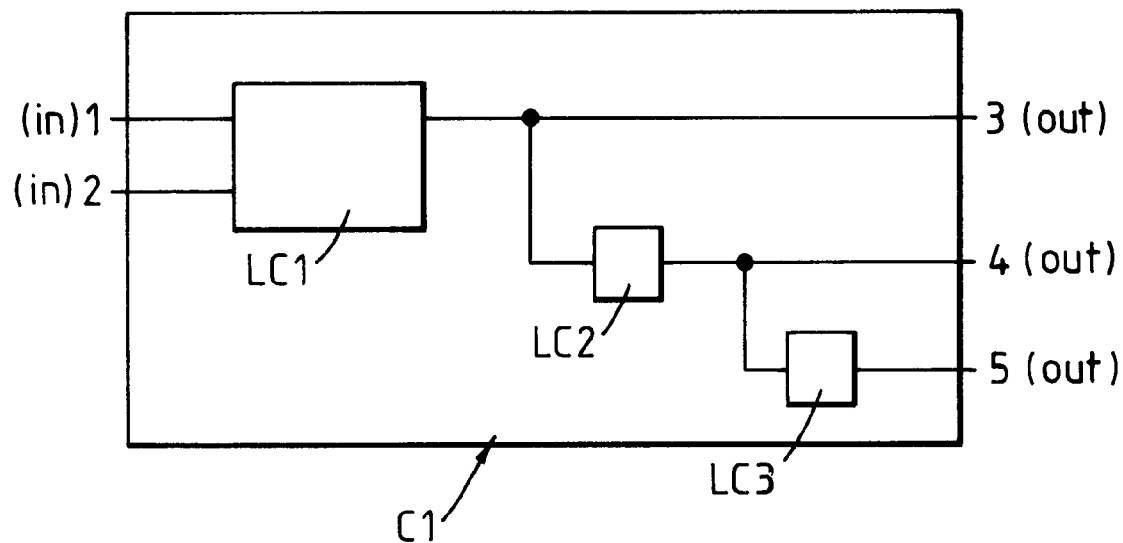
FIGS. 8B and 8C are explanatory diagrams showing cells with multiple extra-pin timing.

It may happen that a particular pin on the timing paths of more than one pair of pins. This is illustrated in FIG. 8B wherein a cell 140 has input pins 1 and 2 and output pins 3, 4 and 5, the paths extending through various lower-level cells. Here, pin 3 lies on the timing path between pins 1 and 4, pin 3 also lies on the timing path between pins 1 and 5 and so on. In the example given, the extra-pin factors are:

extra-pin 1 3 4 extra-pin 1 3 5 extra-pin 1 4 5 extra-pin 2 3 4 extra-pin 2 3 5 extra-pin 2 4 5.

Figure 8C:
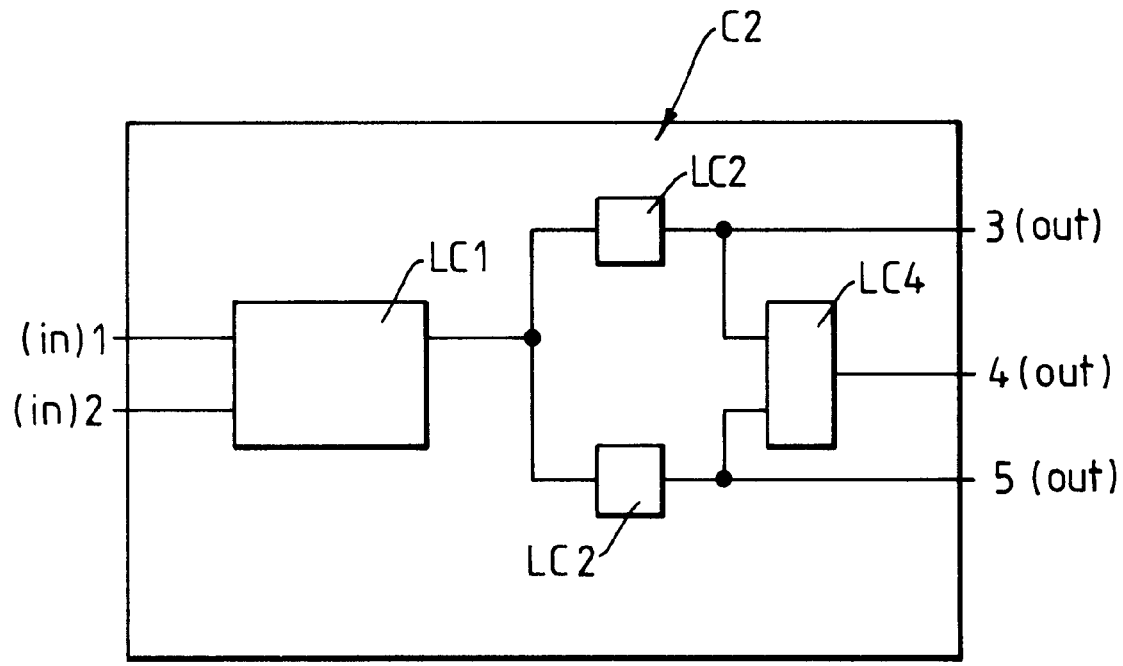

These could be added in cascade. The timing path 1→4 depends upon the load on the output pin 3. The timing path 1→5 depends upon the load on the output pin 3 and also upon the load on output pin 4. One could simply add all the extra-pin timing. However, such would be inadequate for modelling such a cell as shown in FIG. 8C. In this cell, there are multiple extra-pin timings such as (1 3 4) and (1 5 4). Unfortunately one cannot assert that the timing path 1→4 depends upon the loads on pins 3 and 5. It depends on either the load of pin 3 or the load of pin 5, according to the value of these loads and the value of the timing paths 1→3 and 1→5. Nevertheless, a simpler expedient is available. As soon as there is multiple extra-pin timing, one (i.e. the algorithm) can use pin-to-pin timing. Thus we can have a timing path between output connections, i.e. pp 3 1, pp 3 2, pp 4 1 etc.

Propagation of Timing Constraints

Abstract timing models make it possible to analyze efficiently the timing within any cell of the hierarchy. It may be assumed that timing constraints for a cell are expressed in terms of arrival times on inputs of the cell and required times on the outputs. If one knows the arrival times of the inputs of a cell, one can propagate this arrival time through the cell in order to find the arrival times at the inputs of any subcell. This propagation uses the abstract timing model for each instance occurring in the cell and can be performed without reference to the internal contents of any other cell.

Similarly, one can propagate the required times of the outputs of the cell backwards through the cell to find the required times at the outputs of any subcell. This process is completely analogous to propagating arrival times, except that it proceeds in an output-to-input direction instead of input-to-output.

When propagating arrival and required times, one usually performs separate computations for rising and falling signals. Thus, when propagating arrival times, one propagates to each node a rising and falling arrival time; and when propagating required times, one propagates to each node a rising and falling required time.

FIG. 9 illustrates the propagation of arrival times from the inputs of a cell to the inputs of a specified subcell instance within that cell. In this Figure, a top-level cell 90 includes various subcells 91 to 96 such as the inverter 91 and AND gate 92. The cell 90 has four input connectors (pins) 97 and two output connectors (pins) 98. Against each input pin is shown a pair of relative time delays, the first relating to a rising signal transition and the second to a falling signal transition. The particular system of unit is not important. The input-to-output rising and falling delays of each cell are indicated by a pair of numbers within the cell. For example, the numbers 4,3 inside the inverter 91 mean that the inverter has a delay of 4 units for a rising output (i.e. falling input) and a delay of 3 for a falling output (i.e. rising input).

Figure 9A:
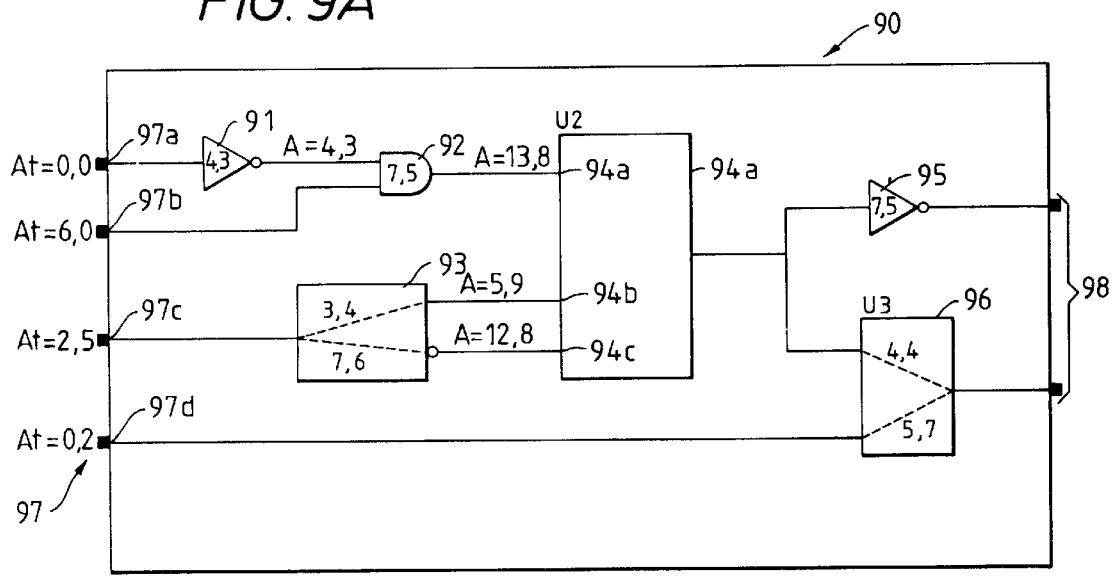
FIGS. 9A and 9B illustrates a top-level cell containing instances of lower-level cells and the propagation of arrival times.
Figure 9B:
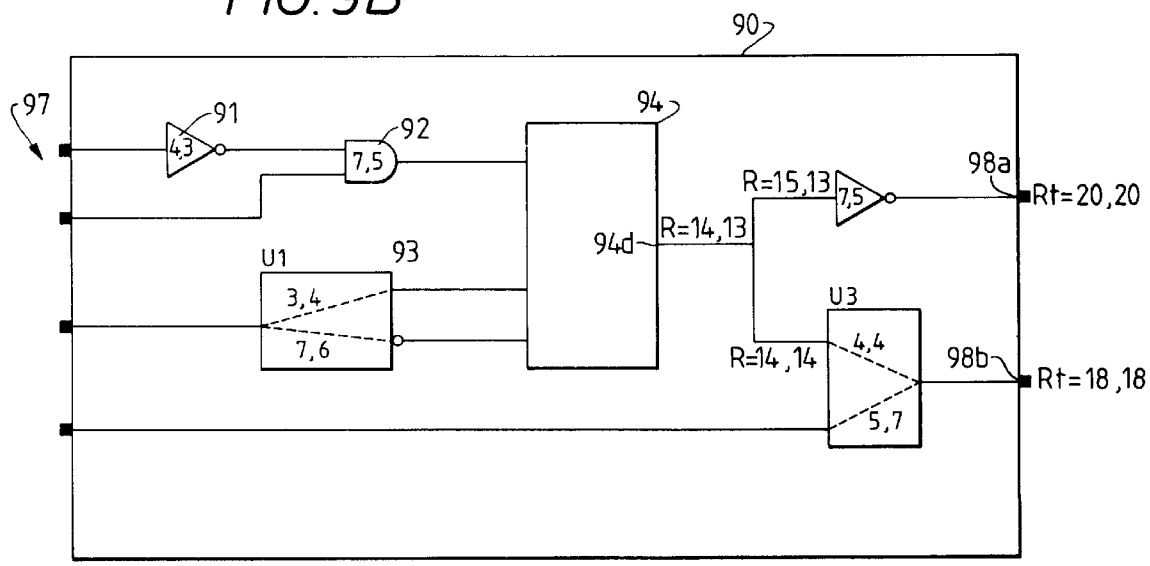

In the example shown in FIG. 9A, the worst-case delay for the rising transition at pin 94a of subcell 94 is computed along the path from pin 97b as 6 units at that pin plus 7 units through the AND gate 92, making 13 units, whereas the worst-case delay of a falling transition is computed along the path from pin 97a via the inverter 91 and the AND gate 92, and is (0+3+5)=8 units. Similarly the transition arrival delay At for each of the pins 94b and 94c propagates from the inputs of thee cell 90 are (5,( ) and 12,8) respectively.

FIG. 9B illustrates again the cell shown in FIG. 9A, but also shows the propagation of required arrival times from output to input, i.e. working backwards from the output pins 98a and 98b of the cell. These two pins have arrival times Rt=(20,20) and Rt=(18,18) respectively, using the same notation as for the values At denoting delays in arrival times. As may be readily seen, the required times Rt at output pin 94d of cell 94 are (14,13). Thus it may be seen that a delay time through subcell 94 is constrained to be the difference between the arrival time at an input pin and the required time at an output pin, so that the input-to-output rising and falling delays from pin 83a, for which At=(13,18) and pin 83d, for which Rt=(14,13) are 1 and 5 respectively.

The automatic computation of abstract timing models and the use of them to propagate automatically constraint information down through the hierarchy are the central ideas of this invention. Below, there is described the application of these ideas, first to the problem of optimizing a single instance of subcell and then to the problem of optimizing an entire netlist.

Method for Propagating Arrival/Required Times to a Nested Instance

The propagation of arrival and required times from the top-level cell to cells that are nested at an arbitrary depth within a hierarchy may be performed in top-down fashion, by the following steps (A1) to (A3), which compute the arrival and required times for the inputs and outputs of a specified subcell instance within the hierarchy:

A1. In the top cell, propagate arrival times from the inputs of the top-level cell to the inputs of the top-level instance within whose hierarchy the targeted instance lies, and propagate the required times from the outputs of the top level cell to the outputs of that top-level instance.

A2. In the instance identified in the previous step, propagate arrival and required times from the inputs and outputs of this instance to the inputs and outputs of the subinstance within whose hierarchy the target instance lies.

A3. Repeat step 2, propagating arrival and required times within successively deeper instances, until the times have been propagated to the inputs and outputs of the target instance.

Method for Optimizing a Subcell Instance

Using the above method, the following is a method for optimizing a single subcell instance within a hierarchical netlist:

B1. Compute abstract timing models (pseudo-PMDs) for all subcells in a bottom-up order.

B2. Propagate the top-level arrival and required times to the inputs and outputs of the target subcell instance, as described above in steps A1 to A3.

B3. Use a 'flat' timing optimizer to optimize the target instance subject to the arrival times on its inputs and the required times on its outputs.

Method for Optimizing a Cell of Which There are Multiple Instances

Usually, the user does not want to individually optimize each instance of each subcell, as so doing would nullify most of the time and space savings of hierarchical optimization. More commonly, it is desired to produce a single optimized copy of each subcell occurring in the design. This introduces an additional problem that is not encountered when optimizing just one instance: the problem of merging constraints. That is, if the above procedure is applied to each instance of the target cell, one gets a different set of arrival and required times for each instance. These various arrival and required times must somehow be merged into a single set of constraints. Even if the flat optimizer were able to accept multiple constraints, the sheer volume of constraints generated would probably slow it down unacceptably, unless a constraint merging approach such as outlined here is used.

Moreover, the target cell may be placed in some other cell which likewise occurs many times in the design. For this containing cell, too, one will have a set of arrival and required times for each instance. The method computes a merged constraint set for this higher-level cell also, thereby avoiding the need to propagate constraints through every instance of this cell.

The following OPTIMIZE/CELL procedure (steps C1 to C4) optimizes a specified cell ('target cell') of which there are multiple instances within a hierarchical design:

C1. Compute abstract timing models (pseudo-PMDs) for all subcells in a bottom-up order.

In the following, we will call a cell a 'containing cell' if it is the target cell or if there is an instance of the target cell within its hierarchy.

C2. Propagate the top-level arrival and required times within the top-level cell, to the inputs and outputs of all top-level instances of containing cells as described above in steps A1 to A3.

C3. Choose a containing cell such that (a) arrival and required times have been propagated to all instances of this cell in the whole design; and (b) arrival and required times have not yet been propagated within this cell Perform the following two substeps:

(i) If there is more than one instance of the chosen cell in the design, use the MERGE CONSTRAINTS procedure described below to merge the arrival and required times.

(ii) If the chosen cell is not the target cell, propagate the merged arrival and required times within the chosen cell to the inputs and outputs of all instances of containing cells in the chosen cell.

C4. Repeat step C3 until the chosen cell in step C3 is the target cell and step C3(i) has been executed on the target cell. Then, use a flat optimizer to optimize the target cell subject to the merged arrival and required times on its inputs and outputs.

The process of choosing a containing cell in step C3 can be made more efficient by means of precomputed lists of cells, which dictate the search order.

The MERGE CONSTRAINTS procedure merges two or more sets of arrival and required times into a single set. It may have the following steps:

D1. For each instance of the chosen cell and each input-to-output path within the instance, set the 'pin-to-pin constraint length' to the required time of the output pin minus the arrival time of the input pin in that instance.

D2. For each input-to-output path of the chosen cell, set the 'merged pin-to-pin constraint length' to the minimum over all instances of the pin-to-pin constraint length for that input-to-output path.

The steps which follow compute a merged arrival time for each input and a merged required time for each output of the chosen cell.

D3. Arbitrarily choose an input pin for which no merged arrival time has yet been computed, and set its merged arrival time to zero.

D4. Repeat the following substeps until there is no more change:

(i) For each input-to-output path such that an arrival time has been computed for the input, set the merged required time of the output to the lesser of the current merged required time of the output (or infinity if the output does not yet have a merged required time) and the sum of the merged arrival time of the input and the merged pin-to-pin constraint length for the path.

(ii) For each input-to-output path such that a required time has been computed for the output, set the merged arrival time of the input to the greater of the current merged arrival time of the input (or to minus infinity if the input does not yet have a merged arrival time) and the difference of the merged required time of the output and the merged pin-to-pin constraint length for the path.

D5. If there are still inputs for which no merged arrival time has been computed, go back to step D3.

The above is one of many possible ways of merging constraints. This constraint-merging method guarantees that the merged constraints have the property that for any input-output pair, the pin-to-pin constraint length after merging is less than or equal to the pin-to-pin constraint length for any instance before merging. In other words, the merged constraint is at least as strict as any of the individual instance constraints.

Possible variations on this constraint-merging method are discussed below.

Example of Optimizing a Cell of Which There are Multiple Instances

Figure 10:
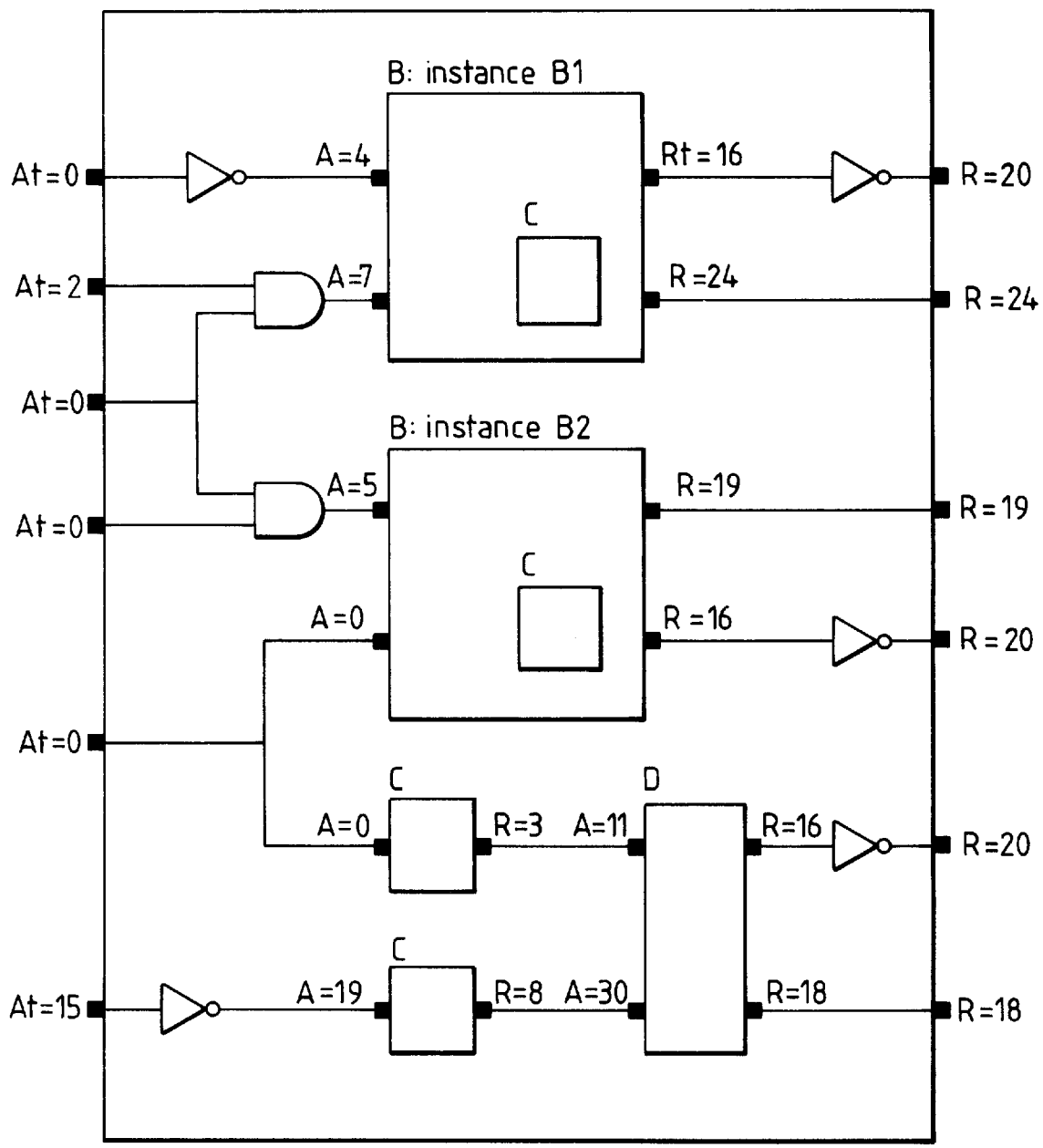
FIG. 10 illustrates a top-level cell.

An example of the OPTIMIZE CELL procedure is illustrated by FIG. 10 and FIGS. 11a to 11f. FIG. 10 shows an illustrative top-level cell A which contains instances of inverters and AND gates, as well as instances of hierarchical subcells B, C and D. There are two instances of cell B, named B1 and B2. Each Cell B contains an instance of cell C, but the internal details of cells B, C and D are not otherwise shown.

In this example, the cell to be optimized is cell C.

Applying the OPTIMIZE CELL procedure to this example, the first step computes pseudo-PMDs for cells C, D and B.

The second step propagates arrival and required times to all cell instances within the top-level cell. FIG. 2 indicates the computed arrival time (e.g. At=7) for each input pin and required time (e.g. Rt=16) for each output pin of each hierarchical cell instance within the top-level cell. For simplicity, no distinction is made between rise delays and fall delays.

The third step begins by choosing a cell. The considerations dictating this choice are:

CELL D. This cell is not a candidate because it does not contain any nested instances of the target cell C.

CELL C. This cell is not a candidate because arrival and required times have not been propagated to all instances of it. Specifically, arrival and required times have not been propagated to the instances of C that are inside cell B.

CELL B. This cell can be chosen, because it contains the target cell C in its hierarchy, and arrival and required times have been propagated to all instances of cell B, but arrival and required times have not yet been propagated within cell B.

Since cell B is the only cell meeting the selection criteria, cell B is chosen, and the substeps of step 3 are executed on it.

Figure 11A:
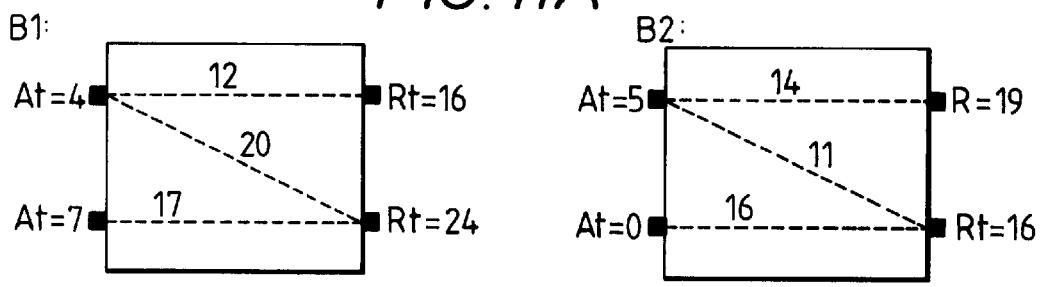
FIGS. 11A to 11F illustrate a process for the merger of pin-to-pin constraint lengths.

FIG. 11A shows the two instances B1 and B2 of cell B within top cell A, the propagated arrival times At and required times Et being those shown in FIG. 10. It is assumed for the sake of simplicity that cell B has a timing path (I101 and I102 respectively) from the upper input to each of the two outputs, a timing path (I202) from the lower input to the lower output, but no timing path from the lower input to the upper output.

First, the pin-to-pin constraint lengths need to be computed. For instance B1, the three lengths are 12, 20 and 17 units respectively and for instance B2, the three lengths are 14, 11 and 16 respectively, each being the difference between the respective required time Rt and the arrival time At.

Figure 11B:
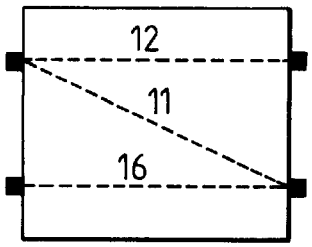

In this example, the merged constraint length for each path is the respective minimum of the timing lengths for that path in the various instances of the cell. Thus, in this example the merged constraint lengths, as shown in FIG. 11b, are 12, 11 and 16 respectively.

Figure 11C:
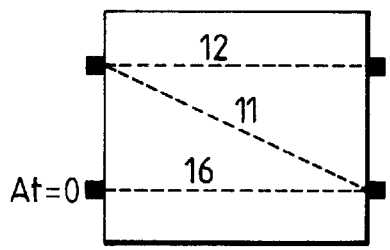

In step D3, (following the MERGE CONSTRAINTS procedure) the lower input is arbitrarily chosen and assigned a merged arrival time of 0, as shown in FIG. 11C.

Figure 11E:
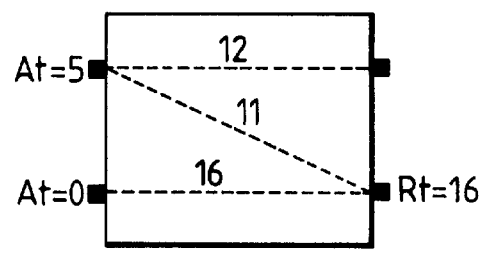
Figure 11D:
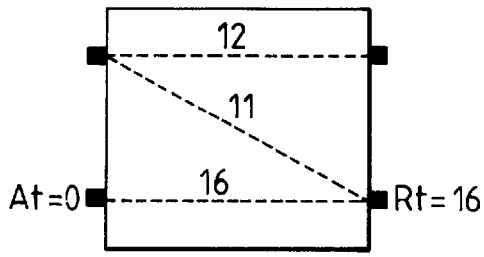
Figure 11F:
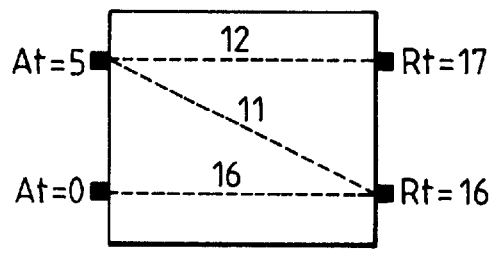

Step D4 alternately computes merged required times for outputs and merged arrival times for inputs. First using step D4(i), as shown in FIG. 11D, outputs that have a path from the lower input, of which there is just one, receive a merged required time. This gives Rt 16 for the lower output Then, using step D4(ii), as shown in FIG. 11E, inputs that have a path to a labelled output receive a merged arrival time: in this step, the time on the lower input is unchanged and the time on the upper input is set to 5. This is obtained by subtracting the respective merged constraint length (11 units) from the merged required time (16 units). Next, step D4(i) is again applied, as shown in FIG. 11F: in this step, the required time of the lower output is unchanged and the required time of the upper output is set to 17 (that is, 5 plus 12). A subsequent application of step D4(ii) produces no changes, so the loop terminates. At this point, we come to step D5: all inputs have a merged arrival time, so the computation stops.

In this simple example, none of the merged arrival or required times changed after being initially computed. This is not true in general: in more complex examples, the merged arrival and required times can change repeatedly in the course of the procedure.

Method for Optimizing an Entire Hierarchical Netlist

Having regard to the foregoing, the following is a method for optimizing an entire hierarchical netlist:

E1. Choose a subcell to optimize.
E2. Optimize the chosen cell using the above 'Method for Optimizing Multiple Instance of a Subcell'.
E3. Substitute the optimized cell for the original cell throughout the hierarchical design.
E4. Repeat steps 1 to 3 until all subcells have been optimized.

Various heuristic methods may be used to choose a subcell in first step. Preferably the cells are selected in bottom-up order, starting with the most deeply nested and proceeding up to the top-level cell. This method has the advantage that once the lower-level cells have been optimized, it is no longer necessary to recompute their abstract timing models or to propagate timing constraints through them, thus reducing the required processing time.

Figure 12:
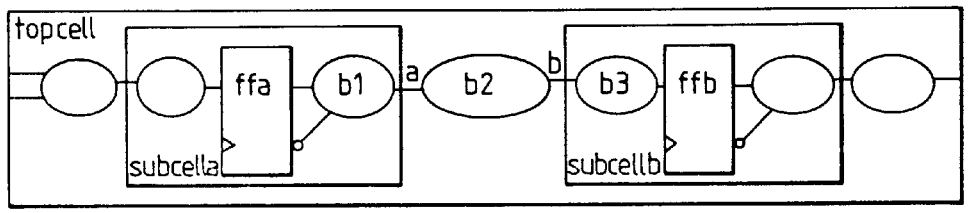
FIG. 12 illustrates a hierarchical netlist.

FIG. 12 presents a simple hierarchical netlist. The netlist hierarchy comprises a top cell including combinatorial blocks, denoted by ovals, and two subcells, subcell a and subcell b, each containing respective instances of a flip-flop, i.e. ffa and ffb and other combinatorial blocks.

The algorithm may choose either subcell a or subcell b to be optimized first. Assume that subcell a is chosen. The required time on its output connector 'a' is automatically computed as the user specified maximum delay, e.g. 20 ns for a clock speed of 50 MHz minus the delay through block b2, minus the set-up time of connector 'b' of subcell b. Descending into subcell a, the constraint on block b1 is computed by setting the arrival time of its input signal to the propagation time of flip-flop ffa, and the required time of its output signal to the required time of output 'a' of subcell a. Block b1 is then optimized subject to this constraint Other combinatorial blocks within subcell a are similarly optimized. When all blocks of subcell a have been optimized, the abstract timing model of subcell a is recomputed.

When subcell b is optimized, the input arrival time on its 'b' connector is computed as the arrival time on subcell a connector 'a' plus the delay through block b2. Descending into subcell b, the constraint on block b3 is computed by setting the arrival time of its input signal to the arrival time of connector 'b' and the required time of its output signal to the user specified constraint minus the set-up time of flip-flop ffb. Block b3 is then optimized subject to this constraint Other blocks of subcell b are similarly optimized, and the abstract timing model of subcell b is recomputed.

Finally, when the top cell is optimized, the input arrival time of block b2 is set to the arrival time of connector 'a' of subcell a, and the output required time is set to the user specified constraint minus the setup time of subcell 'b' connector. Block b2 is then optimized subject to this constraint. The remaining combinatorial blocks of the top cell are similarly optimized, and the optimization is complete.

Figure 13:
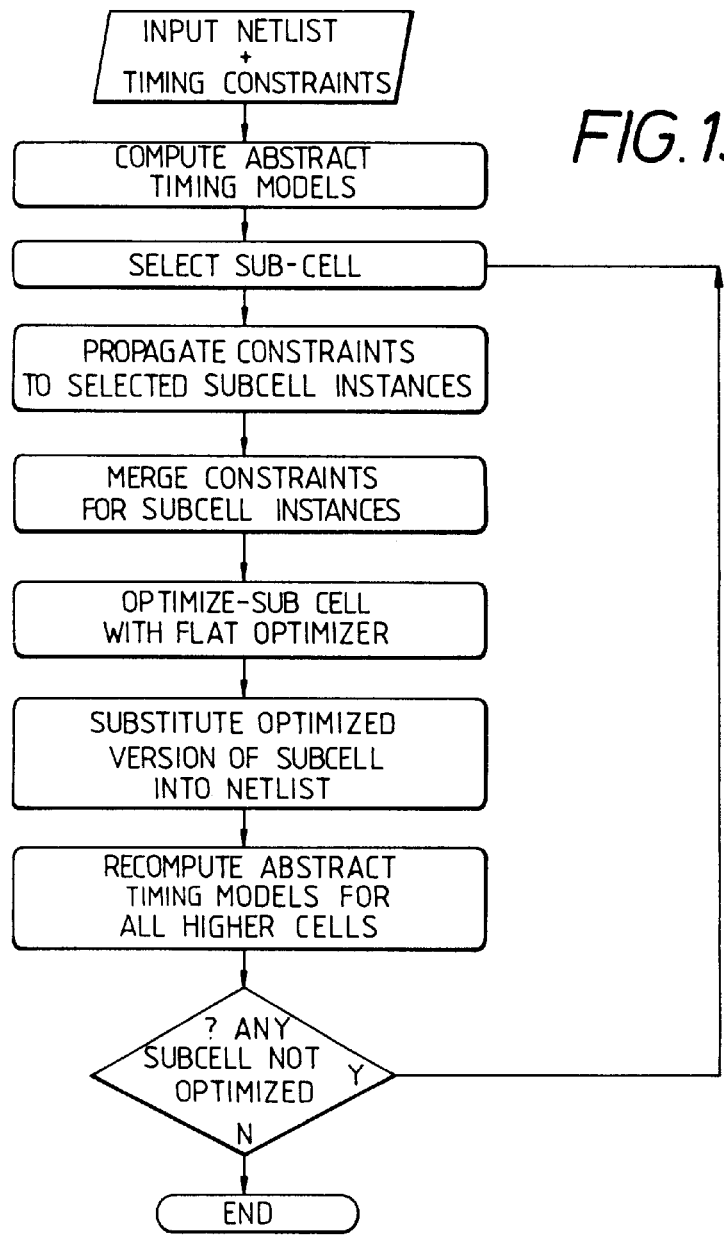
FIG. 13 is a flow diagram of a preferred automated procedures for optimizing a hierarchical netlist.

FIG. 13 is a summary of a preferred automated optimization procedure according to the invention. Step 130 is the input of data representing a hierarchical netlist and externally imposed or user-selected timing constraints. Step 131 is the computation, so far as necessary, of abstract timing models for all the cells in the hierarchical netlist, beginning with the deepest and most primitive. Step 132 comprises the selection of a cell which has not yet been optimized. Step 133 is the propagation of timing constraints to all, or at least a selected group of instances of that subcell. Step 134 comprises the merger of the constraints for those instances of the subcell. Step 135 comprises the optimization of the subcell using a flat optimizer. Step 136 is the substitution of the optimized version of the subcell for all the instances of the subcell (or the selected group of instances). Step 137 comprises the recomputation of the abstract timing models for all the cells of higher level than, and containing, the subcell. Step 138 comprises the determination whether any unoptimized cells remain, the procedure either terminating (step 139) or returning to step 132.

Some possible variations of the MERGE CONSTRAINTS procedure are discussed here.

The loop in step D4 of the procedure could be made more efficient by maintaining lists of inputs and outputs whose merged arrival or required time has changed during each substep. Thus, in step D4(ii), one only has to consider outputs that have a path from an input that changed during the preceding application of step D4(i). Similarly, when executing step D4(i) after the first time through the loop, one only has to consider inputs that have a path to an output that changed during the preceding application of step D4(ii).

It is not necessary to wait until constraints for all instances have been computed before merging them. Instead, one can update the merged pin-to-pin constraint lengths one instance at a times. That is, as soon as arrival and required times have been propagated to a given instance of the target cell, the pin-to-pin constraint lengths for that instance are computed and combined into the merged pin-to-pin constraint lengths by taking the minimum of the new length and the current merged length for each input-to-output path. Then, after all instances have been merged in, steps D3 to D5 are executed.

In step D4, there is no limit on how much any merged pin-to-pin constraint length will be reduced from its original value. The constraint length for some paths may be reduced by a lot, while others are unchanged. It may be desired to place a lower bound on how much any given constraint length can be reduced, in order to even out this potential imbalance. For example, one might stipulate that no merged pin-to-pin constraint length should be reduced by more than 30% from its original value. With such constraints, the problem of computing merged constraint lengths can be formulated and solved as a linear programming problem, using standard linear programming techniques.

It has been assumed that the flat optimizer accepts constraints in the form of arrival times on inputs and required times on outputs. It is possible that the flat optimizer can accept constraints in a different form, consisting of a maximum input-to-output path length for one or more input-output pairs. In this case, the MERGE CONSTRAINTS procedure can stop after step 2, and the computed merged pin-to-pin constraint lengths can be passed directly to the flat optimizer.

Similarly, the user may wish to specify multiple sets of constraints at the top level, to be independently satisfied. For example, one set of constraints may specify arrival times for inputs {A1, A2, A3} and required times for outputs {Z1, Z2}, and a second set of constraints may specify arrival times for {A4, A5} and a required time for output {Z3}. This can be handled by modifying the procedure for propagating constraints to propagate each set separately. First, arrival and required times are propagated for the first set of constraints, and pin-to-pin constraint lengths for each target instance are computed based on these. Then, the arrival and required times are all cleared and the second set of constraints is propagated, and each pin-to-pin constraint length in each target instance is set to the lesser of the length computed from the first constraint set and the length computed from the second constraint set. If there is a third constraint set, it is handled in the same way as the second, and so on.

Table I below illustrates comparative examples of optimizing hierarchical netlists composed exclusively of standard cells, generated by a VHDL RTL-level synthesis tool. The second to fourth columns show the results from a flat optimization after flattening the netlist, whereas the fifth to seventh columns show the results from a hierarchical optimizer according to the invention:

TABLE I

| test | Flat Optimization | | | Hierarchical Optimization | | |
|---|---|---|---|---|---|---|
| | cp | number | speed | cp | number | speed |
| 1 | 4 | 1262 | 33.5 | 2.5 | 1262 | 32 |
| 2 | 5 | 1874 | 17.1 | 4 | 2178 | 17.2 |
| 3 | 12 | 2610 | 25.10 | 8 | 2898 | 23.5 |
| 4 | 11 | 4790 | 37 | 20 | 5170 | 42.7 |
| 5 | 96 | 11318 | 110 | 30 | 14865 | 106 |

In Table I, 'cp' refers to central processing time, 'number' is a gate count and 'speed' refers to the delay through the optimized netlist.

From these results, we can observe:

the hierarchical optimizer is faster than the flat one, when the hierarchical netlist contains repeated instances of subcells (cases 1, 2 and 3);

the circuit delays from the hierarchical optimizer are close to those of the flat optimizer; and surprisingly, the hierarchical optimizer sometimes gives faster circuits than the flat optimizer. This seems to happen when the flattened circuits contain very large logic blocks that are difficult for the flat optimizer to optimize (cases 3 and 5).

A useful modification of the procedure as described above is for the optimizer to automatically create more than one optimized version of a cell when this is expedient for meeting timing constraints, so that for example instances of the same cell are automatically clustered into groups according to their constraint sets, each group being separately optimized with its own constraints.

If the first block optimized is called on to meet the full timing deficit of any timing paths on which it lies, the constraints on subsequent blocks along the same paths are eased. However, if there is more than one instance of a cell along a given timing path, the effects of any improvement or degradation of the timing of the cell can be multiplied by the number of times it occurs on the path. This effect can be amehorated by the allocation of slack time between blocks and, alternatively or additionally between hierarchy levels. Although in the detailed scheme described earlier the deepest cells are optimized first, even though optimizing some higher-level cells first might give a better time-area trade-off.

Conclusions

The foregoing describes a hierarchical timing optimizer, which optimizes a hierarchical netlist by automatically charactersing the timing behaviour of subcells, generating inducing subconstraints for those subcells, and optimizing the subcells with a flat netlist optimizer. The delays of optimized circuits are usually very close to, if not better than, the results of flattening the circuit and doing a flat optimization. Moreover, for some circuits hierarchical optimization gives significant savings of cpu time compared to flat optimization. One area where the hierarchical optimizer has a decided advantage over a flat optimizer is in optimizing netlists that combine random logic with precompiled layout blocks.

We claim:

1. A method of automatically optimizing a hierarchical netlist of integrated circuit cells comprising at least one upper-level cell containing a multiplicity of subsidiary cells of lower hierarchical level, the method comprising the steps, performed by a programmed data processor, of:

(i) receiving data defining said hierarchical netlist and timing constraints therefor;

(ii) establishing abstract timing models for all of said subsidiary cells;

(iii) propagating timing constraints to at least one selected subsidiary cell of said subsidiary cells;

(iv) optimizing said selected subsidiary cell by means of a flat optimizer to produce an optimized version of said selected subsidiary cell, wherein said upper-level cell contains a multiplicity of instances of said selected subsidiary cell, said optimizing step including the steps of propagating said timing constraints to each of a multiplicity of different cells of said selected subsidiary cell, merging said timing constraints for said multiplicity of instances of said selected subsidiary cell, to provide a merged set of timing constraints for all of said instances of said selected subsidiary cell, and optimizing, in accordance with said merged set of timing constraints a single instance of said selected subsidiary cell with said flat optimizer, to produce said optimized version of said selected subsidiary cell; and (v) substituting said optimized version of said selected subsidiary cell for all instances of said selected subsidiary cell into said netlist.

2. A method according to claim 1 wherein the said timing constraints denote arrival times for signals at inputs of a cell and required times for signals at outputs of a cell.

3. A method according to claim 2 wherein each abstract timing model of a cell comprises timing parameters which enable a delay time between-a specified input of a cell to a specified output of a cell to be computed.

4. A method according to claim 3 wherein the netlist comprises at least one top-level cell containing instances of intermediate level cells each of which contains instances of lowest level cells, said lowest level cells having predefined abstract timing models, and wherein the said establishing step comprises:

computing the abstract timing models for all the intermediate level cells in ascending hierachical order beginning with the lowest level cells.

5. A method according to claim 1, further comprising:

recomputing abstract timing models for all higher cells than said selected susidiary cell subsequent to the substitution of the optimized version of the subcell into the netlist.

6. A method of fabricating an application-specific integrated circuit from a user-selected, input specification of said circuit, comprising the steps of:

(a) performing by an automatic programmed data processor which includes a cell library the following steps:

(1) responding to said user-selected, input specification to synthesize and generate a netlist composed of cells from said cell library;

(2) optimizing said netlist; and (3) generating semiconductor mask data from the optimized netlist; and (b) fabricating the integrated circuit under control of said mask data; wherein said netlist is a hierarchical netlist of integrated circuit cells comprising at least one upper-level cell containing a multiplicity of subsidiary cells of lower hierarchical level, said upper-level cell being incapable of optimization by a flat optimizer, and wherein the optimizing step comprises:
(i) receiving data defining said netlist and timing constraints therefor;
(ii) establishing abstract timing models for all said subsidiary cells;
(iii) propagating timing constraints to at least one selected subsidiary cell;
(iv) optimizing said selected cell by means of a flat optimizer to produce an optimized version of said selected subsidiary cell, wherein said upper-level cell contains a multiplicity of instances of said selected subsidiary cell, said optimizing step including the steps of
propagating said timing constraints to each of a multiplicity of different cells of said selected subsidiary cell,
merging the timing constraints for the multiplicity of instances of said selected subsidiary cell, to provide a merged set of timing constraints for all of said instances of said selected subsidiary cell, and
optimizing, in accordance with said merged set of timing constraints a single instance of said selected subsidiary cell with said flat optimizer, to produce said optimized version of said selected subsidiary cell; and
(v) substituting said optimized version of said selected subsidiary cell for all instances of said selected subsidiary cell into said netlist.

7. A method according to claim 6 wherein the said timing constraints denote arrival times for signals at inputs of a cell and required times for signals at outputs of a cell.

8. A method according to claim 6 wherein each abstract timing model of a cell comprises timing parameters which enable a delay time between a specified input of a cell to a specified output of a cell to be computed.

9. A method according to claim 6 wherein the netlist comprises at least one top-level cell containing instances of intermediate level cells each of which contains instances of lowest level cells, said lowest level cells having predefined abstract timing models, and wherein the said establishing step comprises:
computing the abstract timing models for all the intermediate level cells in ascending hierachical order beginning with the lowest level cells.

10. A method according to claim 6, wherein said upper-level contains a multiplicity of instances of the said selected subsidiary cell and the method further comprises:
propagating said timing constraints to each of a multiplicity of different instances of the selected subsidiary cell;
merging the timing constraints for the multiplicity of instances of the selected subsidiary cell, to provide a merged set of timing constraints for all the said instances of the subsidiary cell;
optimizing in accordance with the said merged set of timing constraints a single instance of the said subsidiary cell by means of said flat optimizer, to produce said optimized version of the said subsidiary cell; and
substituting the optimized version of the subsidiary cell for all the instances of the subsidiary cell in the multiplicity thereof.

11. A method according to claim 6, further comprising:
recomputing abstract timing models for all higher cells than said selected susidiary cell subsequent to the substitution of the optimized version of the subcell into the netlist.

* * * * *